(12) United States Patent
Kim et al.

(10) Patent No.: US 8,159,069 B2
(45) Date of Patent: Apr. 17, 2012

(54) METAL LINE OF SEMICONDUCTOR DEVICE WITHOUT PRODUCTION OF HIGH RESISTANCE COMPOUND DUE TO METAL DIFFUSION AND METHOD FOR FORMING THE SAME

(75) Inventors: Baek Mann Kim, Gyeonggi-do (KR);
Seung Jin Yeom, Gyeonggi-do (KR);
Dong Ha Jung, Gyeonggi-do (KR);
Jeong Tae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/940,521

(22) Filed: Nov. 5, 2010

(65) Prior Publication Data

US 2011/0053370 A1 Mar. 3, 2011

Related U.S. Application Data

(62) Division of application No. 12/328,988, filed on Dec. 5, 2008, now Pat. No. 7,855,456.

(30) Foreign Application Priority Data

Jan. 2, 2008 (KR) .................. 10-2008-0000337

(51) Int. Cl.
*H01L 23/48* (2006.01)
(52) U.S. Cl. ............ 257/751; 257/734; 257/E23.16; 257/E21.584; 438/627; 438/643; 438/653
(58) Field of Classification Search ............ 257/734, 257/751, E23.141, E21.034, E23.16, E21.584; 438/627, 643, 653
See application file for complete search history.

(56) References Cited

U.S. PATENT DOCUMENTS

| 6,284,646 | B1 * | 9/2001 | Leem ................ 438/629 |
| 2003/0224217 | A1 | 12/2003 | Byun et al. |
| 2006/0170103 | A1 * | 8/2006 | Suh et al. ............ 257/751 |
| 2006/0276033 | A1 | 12/2006 | Nguyen et al. |

FOREIGN PATENT DOCUMENTS

| KR | 1019980072437 A | 11/1999 |
| KR | 1020040056111 A | 6/2004 |
| KR | 1020040077042 A | 9/2004 |
| KR | 1020050106916 A | 11/2005 |

OTHER PUBLICATIONS

USPTO OA mailed Oct. 8, 2009 in connection with U.S. Appl. No. 12/328,988.

(Continued)

*Primary Examiner* — A. Sefer
*Assistant Examiner* — Farid Khan
(74) *Attorney, Agent, or Firm* — Ladas & Parry LLP

(57) ABSTRACT

A metal line includes a lower metal line formed on a semiconductor substrate. An insulation layer is formed on the semiconductor substrate having the lower metal line, and a metal line forming region exposing at least a portion of the lower metal line is defined in the insulation layer. A diffusion barrier is formed on a surface of the metal line forming region of the insulation layer and includes a $WN_x$ layer, a W—N—B ternary layer, and a Ti—N—B ternary layer. A wetting layer is formed on the diffusion barrier and is made of one of a Ti layer or a TiN layer. An upper metal line is formed on the wetting layer to fill the metal line forming region of the insulation layer.

20 Claims, 5 Drawing Sheets

OTHER PUBLICATIONS

USPTO OA mailed Jan. 19, 2010 in connection with U.S. Appl. No. 12/328,988.

USPTO NOA mailed Aug. 16, 2010 in connection with U.S. Appl. No. 12/328,988.

* cited by examiner

METAL LINE OF SEMICONDUCTOR DEVICE WITHOUT PRODUCTION OF HIGH RESISTANCE COMPOUND DUE TO METAL DIFFUSION AND METHOD FOR FORMING THE SAME

CROSS-REFERENCE TO RELATED APPLICATIONS

The present application claims priority to Korean patent application number 10-2008-0000337 filed on Jan. 2, 2008, which is incorporated herein by reference in its entirety.

BACKGROUND OF THE INVENTION

The present invention relates generally to a metal line of a semiconductor device and a method for forming the same, and more particularly, to a metal line of a semiconductor device which can prevent a high resistance compound from being produced due to diffusion of different metals when joining the different metals with each other and a method for forming the same.

In a semiconductor device, metal lines are formed to electrically connect elements or lines with each other. Contact plugs are formed to connect lower metal lines and upper metal lines with each other. As the integration level of the semiconductor continues to increase, the aspect ratio of a contact hole, in which a contact plug is formed, gradually increases. As a result, the difficulty and the importance of a process for forming the metal line and the contact plug have been noted.

The metal line of a semiconductor device is usually formed of aluminum or tungsten because both have good electrical conductivity. Recently, research has been conducted regarding the use of copper to form the metal line of a semiconductor device because copper has excellent electrical conductivity and copper has a low resistance when compared to aluminum and tungsten. Forming the metal line of a semiconductor device with copper (Cu) can therefore solve the problems associated with conventional metal lines of highly integrated semiconductor devices having high operating speed such as RC signal delay.

It is difficult to dry-etch copper into a wiring pattern, and therefore to form a metal line using copper a damascene process is employed.

In the damascene process, a metal line forming region is formed by etching an interlayer dielectric, and a metal line is formed by filling a metal layer (i.e., a copper layer) in the metal line forming region. Here, the metal line forming region can be formed through one of a single damascene process and a dual damascene process. In particular, in the dual damascene process, an upper metal line and a contact plug for connecting the upper metal line and a lower metal line can be simultaneously formed. Also, since surface undulations that are produced due to the presence of the metal line can be removed, a subsequent process can be conveniently conducted.

When forming a multi-layered metal line using the damascene process, copper may be used as the material for a lower metal line and aluminum is used as the material for an upper metal line, when different metals are joined with each other as described above, a high resistance compound may be produced due to diffusion of the respective metals. Therefore, in order to prevent the high resistance compound from being produced, a diffusion barrier must be formed on the interface of the lower metal line made of a copper layer and the upper metal line made of an aluminum layer. Generally, a Ti or TiN layer, which is deposited through sputtering, is used as the diffusion barrier.

Further, the diffusion barrier must have a sufficient thickness to stably perform its function. However, while it is possible to prevent the production of a high resistance compound when the diffusion barrier has a sufficient thickness, as the thickness of the diffusion barrier is increased, the proportional thickness of the aluminum layer decreases, and in this case contact resistance cannot be decreased sufficiently.

Conversely, to improve the decrease in the contact resistance problem, the thickness of the diffusion barrier may be reduced. However, due to the diffusion of aluminum, of which the upper metal line is formed, voids can be formed in the aluminum layer and a high resistance compound is likely produced when the diffusion barrier thickness is reduced. As a result, the contact resistance is increased and both the semiconductor device characteristics and reliability will deteriorate.

SUMMARY OF THE INVENTION

Embodiments of the present invention include a metal line of a semiconductor device which can improve the characteristics of a diffusion barrier and a method for forming the same.

Also, embodiments of the present invention include a metal line of a semiconductor device which can improve the characteristics and the reliability of a semiconductor device and a method for forming the same.

In one embodiment of the present invention, a metal line of a semiconductor device comprises a lower metal line formed on a semiconductor substrate; an insulation layer formed on the resultant semiconductor substrate and having a metal line forming region which exposes at least a portion of the lower metal line; a diffusion barrier formed on a surface of the metal line forming region of the insulation layer and having a $WN_x$ layer, a W—N—B ternary layer and a Ti—N—B ternary layer; a wetting layer formed on the diffusion barrier and made of any one of a Ti layer or a TiN layer; and an upper metal line formed on the wetting layer to fill the metal line forming region of the insulation layer.

The lower metal line comprises a copper layer, and the upper metal line comprises an aluminum layer.

In the $WN_x$ layer, x has a range of 0.3~3.0.

In another embodiment of the present invention, a metal line of a semiconductor device comprises a lower metal line formed on a semiconductor substrate; an insulation layer formed on the resultant semiconductor substrate and having a metal line forming region which exposes at least a portion of the lower metal line; a diffusion barrier formed on a surface of the metal line forming region of the insulation layer and having a $WN_x$ layer, a W—N—B ternary layer and a Ta—N—B ternary layer; a wetting layer formed on the diffusion barrier and made of any one of a Ta layer or a TaN layer; and an upper metal line formed on the wetting layer to fill the metal line forming region of the insulation layer.

The lower metal line comprises a copper layer, and the upper metal line comprises an aluminum layer.

In the $WN_x$ layer, x has a range of 0.3~3.0.

In still another embodiment of the present invention, a method for forming a metal line of a semiconductor device comprises the steps of forming a lower metal line on a semiconductor substrate; forming an insulation layer having a metal line forming region which exposes at least a portion of the lower metal line, on the resultant semiconductor substrate; forming a $WN_x$ layer and a W—N—B ternary layer on the insulation layer including a surface of the metal line forming region; forming a wetting layer on the W—N—B ternary layer, which is made of any one of a Ti layer or a TiN layer; annealing the resultant semiconductor substrate which is formed with the wetting layer, and thereby forming a Ti—N—B ternary layer on a lower end of the wetting layer, which constitutes a diffusion barrier along with the $WN_x$ layer and the W—N—B ternary layer; and forming an upper metal line on the wetting layer to fill the metal line forming region.

The lower metal line comprises a copper layer, and the upper metal line comprises an aluminum layer.

In the $WN_x$ layer, x has a range of 0.3~3.0.

The $WN_x$ layer is formed through any one of PVD, CVD, and ALD.

The $WN_x$ layer is formed to a thickness of 30~500 Å.

The W—N—B ternary layer is formed by penetrating boron into the $WN_x$ layer.

The boron penetration is implemented through annealing that uses boron-based gas or through plasma processing.

The boron-based gas comprises $B_2H_6$.

The W—N—B ternary layer is formed to have a thickness corresponding to 10~100% of the thickness of the $WN_x$ layer.

The wetting layer is formed through any one of PVD, CVD and ALD.

The wetting layer is formed to a thickness of 100~500 Å.

The Ti—N—B ternary layer is formed by penetrating boron and nitrogen of the W—N—B ternary layer into the wetting layer comprising the Ti layer or TiN layer.

The Ti—N—B ternary layer is formed to a thickness corresponding to 10~50% of the thickness of the wetting layer.

In another embodiment of the present invention, a method for forming a metal line of a semiconductor device comprises the steps of forming a lower metal line on a semiconductor substrate; forming an insulation layer having a metal line forming region which exposes at least a portion of the lower metal line, on the resultant semiconductor substrate; forming a $WN_x$ layer and a W—N—B ternary layer on the insulation layer including a surface of the metal line forming region; forming a wetting layer on the W—N—B ternary layer, which is made of any one of a Ta layer or a TaN layer; annealing the resultant semiconductor substrate which is formed with the wetting layer, and thereby forming a Ta—N—B ternary layer by transforming a lower portion of the wetting layer, which constitutes a diffusion barrier along with the $WN_x$ layer and the W—N—B ternary layer; and forming an upper metal line on the wetting layer to fill the metal line forming region.

The lower metal line comprises a copper layer, and the upper metal line comprises an aluminum layer.

In the $WN_x$ layer, x has a range of 0.3~3.0.

The $WN_x$ layer is formed through any one of PVD, CVD, and ALD.

The $WN_x$ layer is formed to a thickness of 30~500 Å.

The W—N—B ternary layer is formed by penetrating boron into the $WN_x$ layer.

The boron penetration is implemented through annealing that uses boron-based gas or through plasma processing.

The boron-based gas comprises $B_2H_6$.

The W—N—B ternary layer is formed to have a thickness corresponding to 10~100% of the thickness of the $WN_x$ layer.

The wetting layer is formed through any one of PVD, CVD and ALD.

The wetting layer is formed to a thickness of 100~500 Å.

The Ta—N—B ternary layer is formed by penetrating boron and nitrogen of the W—N—B ternary layer into the wetting layer comprising the Ta layer or TaN layer.

The Ta—N—B ternary layer is formed to a thickness corresponding to 10~50% of the thickness of the wetting layer.

DESCRIPTION OF SPECIFIC EMBODIMENTS

Hereafter, the specific embodiments of the present invention will be described in detail with reference to the attached drawings.

Figure 1:
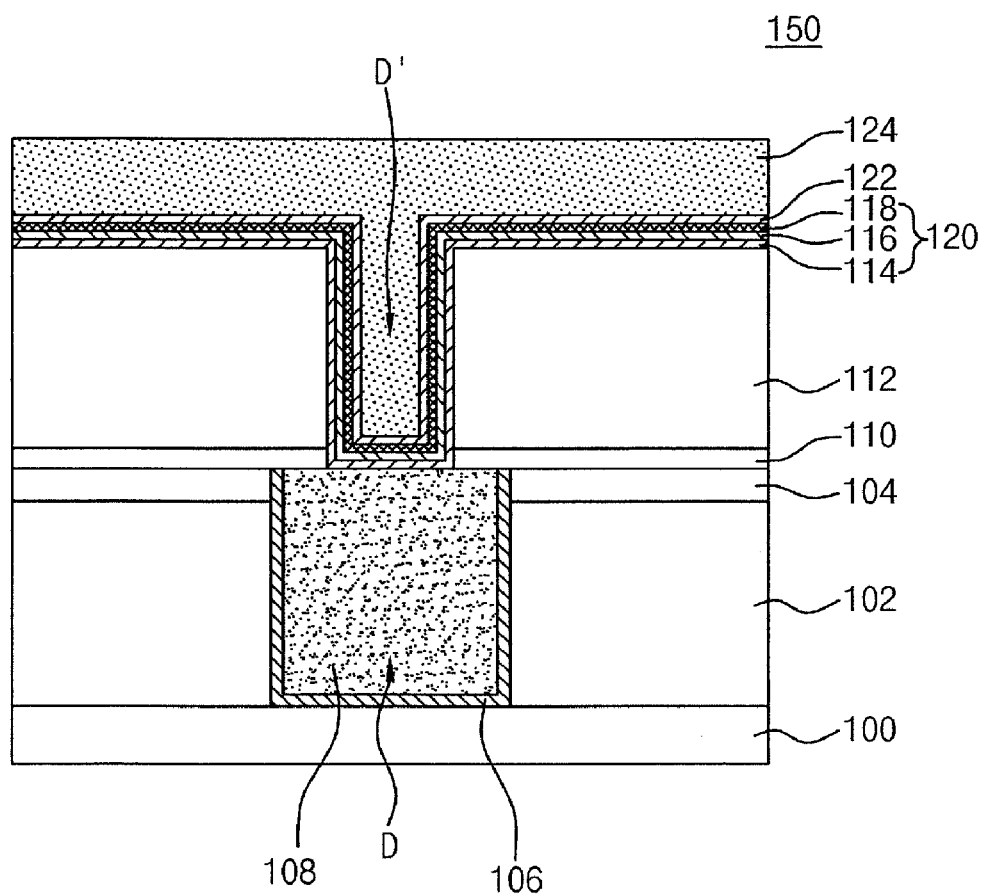
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, an interlayer dielectric 102 and a polish stop layer 104 are sequentially formed on a semiconductor substrate 100 which is formed with an understructure (not shown) including transistors. A first metal line forming region D is defined in the interlayer dielectric 102 and the polish stop layer 104. A lower metal line 108 comprising a copper layer is formed in the first metal line forming region D. The reference numeral 106 designates a barrier layer for preventing the diffusion of copper.

An etch stop layer 110 and an insulation layer 112 are sequentially formed on the polish stop layer 104 including the lower metal line 108. A second metal line forming region D' is defined in the insulation layer 112 and the etch stop layer 110 to expose at least a portion of the lower metal line 108. An upper metal line 124 comprising an aluminum layer is formed on the insulation layer 112 including the second metal line forming region D'.

A diffusion barrier 120 is formed on the surface of the insulation layer 112 including the second metal line forming region D', on which the upper metal line 124 is formed. In the present embodiment, the diffusion barrier 120 may be a stacked structure comprising a $WN_x$ layer 114, a W—N—B ternary layer 116, and a Ti—N—B ternary layer 118. Alternatively, the diffusion barrier 120 may be a stacked structure comprising a $WN_x$ layer 114, a W—N—B ternary layer 116, and a Ta—N—B ternary layer (not shown). In the $WN_x$ layer 114, x has a range of 0.3~3.0. A wetting layer 122 comprising any one of a Ti layer, a TiN layer, a Ta layer, and a TaN layer is formed on the diffusion barrier 120 having the above stacked structure. Together the lower metal line 108 and the upper metal line 124 constitute a metal line 150.

As described above, when copper is used as the material for a lower metal line and aluminum is used as the material for an upper metal line, in the present invention, a stacked structure including a $WN_x$ layer, a W—N—B ternary layer, and a Ti—N—B ternary layer, or a stacked structure including a $WN_x$ layer, a W—N—B ternary layer, and a Ta—N—B ternary layer, is formed as a diffusion barrier 120 on the interface of the lower metal line and the upper metal line. Further, in the present invention, a wetting layer comprising any one of a Ti layer, a TiN layer, a Ta layer, and a TaN layer is formed on the diffusion barrier 120.

The diffusion barrier 120 comprising the stack of the $WN_x$ layer, the W—N—B ternary layer, and the Ti—N—B ternary layer, or the stack of the $WN_x$ layer, the W—N—B ternary layer, and the Ta—N—B ternary layer, prevents the diffusion between different metals reliably while also decreasing the thickness of the diffusion barrier 120 when compared to a conventional diffusion barrier comprising a Ti or TiN layer deposited through sputtering. Additionally, the wetting layer allows the deposition of the aluminum layer constituting the upper metal line to be carried out continuously.

Therefore, in the present invention, it is possible to prevent a high resistance metal compound from being formed or produced on the interface of different metals and it is possible to prevent voids from being formed in the aluminum layer constituting the upper metal line. As a result, in the present invention, it is possible to improve both the characteristics and the reliability of a semiconductor device by preventing contact resistance from increasing.

FIGS. 2A through 2G are cross-sectional views showing the processes of a method for forming a metal line of a semiconductor device in accordance with another embodiment of the present invention. The method will be described below.

Figure 2A:
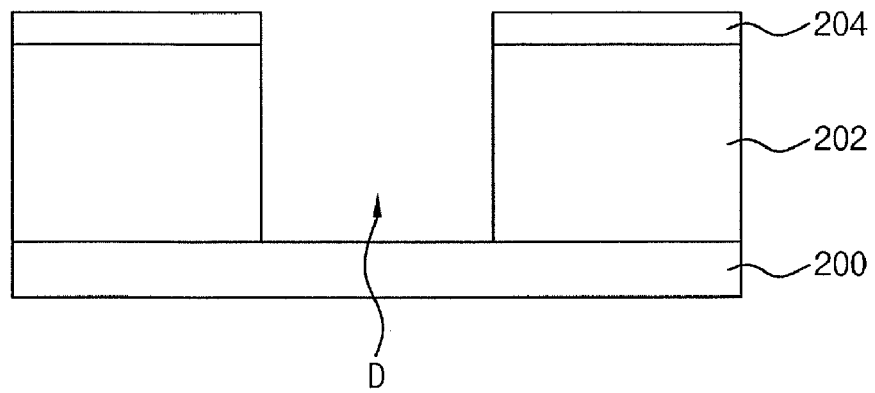
FIGS. 2A through 2G are cross-sectional views showing the processes of a method for forming a metal line of a semiconductor device in accordance with another embodiment of the present invention.

Referring to FIG. 2A, an interlayer dielectric 202 is formed on a semiconductor substrate 200, which is formed with an understructure including transistors, and a polish stop layer 204 is formed on the interlayer dielectric 202. A first metal line forming region D, in which a lower metal line is to be formed, is defined by etching the polish stop layer 204 and the interlayer dielectric 202. The first metal line forming region D may be defined to have a single structure including a trench or a dual structure including a trench and a via-hole.

Figure 2B:
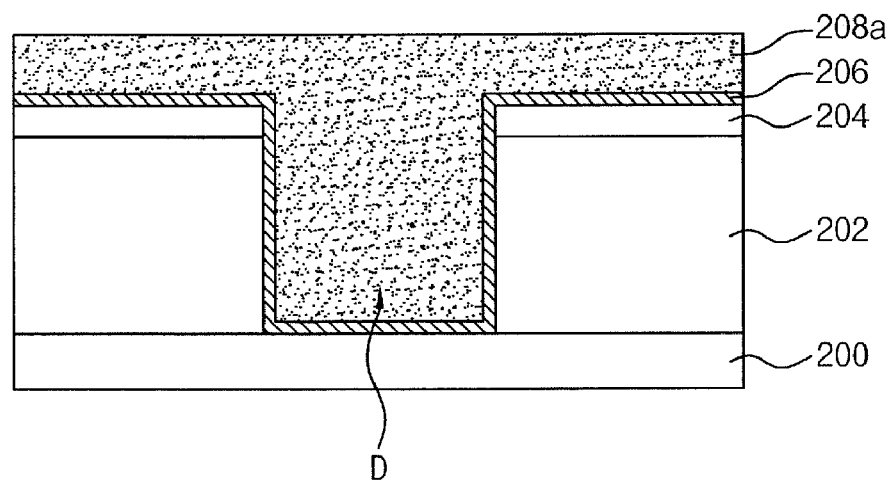

Referring to FIG. 2B, a TaN or Ta layer 206 is formed on the polish stop layer 204 including the surface of the first metal line forming region D to prevent diffusion of copper. A metal layer, for example a copper layer 208a, for forming a lower metal line is deposited on the TaN or Ta layer 206 to fill the first metal line forming region D. It is preferred that the deposition of the copper layer 208a be implemented through electroplating after depositing a seed layer on the TaN or Ta layer 206.

Figure 2C:
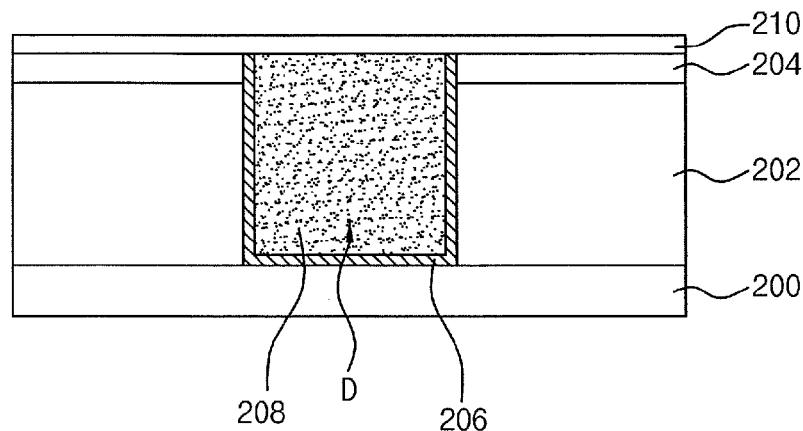

Referring to FIG. 2C, a lower metal line 208 is formed in the first metal line forming region D by removing the copper layer 208a and the TaN or Ta layer 206 through a chemical mechanical polishing (CMP) process until the polish stop layer 204 is exposed. An etch stop layer 210 is formed on the lower metal line 208, including the TaN or Ta layer 206, and the polish stop layer 204.

Figure 2D:
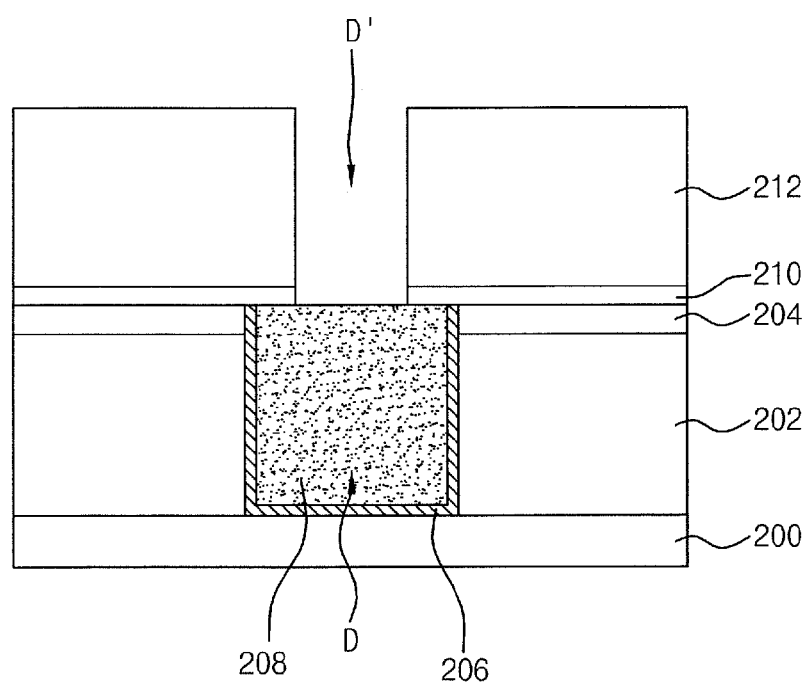

Referring to FIG. 2D, an insulation layer 212 is formed on the etch stop layer 210, then a second metal line forming region D' is defined to expose at least a portion of the lower metal line 208 by etching the insulation layer 212 and the etch stop layer 210.

Figure 2E:
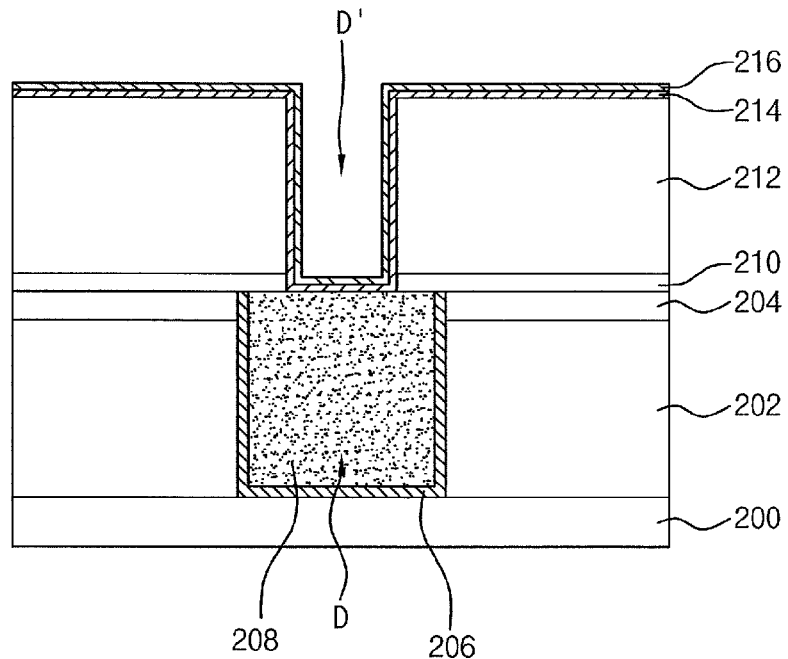

Referring to FIG. 2E, a $WN_x$ layer 214 is formed on the insulation layer 212 and the surface of the second metal line forming region D' defined by the prior etching of the etch insulation layer 212 and the lower etch stop layer 210. The $WN_x$ layer 214 comprises a nitrogen-rich layer with x having a range of 0.3~3.0 and the $WN_x$ layer is formed to a thickness of 30~500 Å. The $WN_x$ layer 214 can be formed in several ways, three exemplary ways will be described below.

First, the $WN_x$ layer 214 can be formed through physical vapor deposition (PVD). In this case, ionized PVD (I-PVD) having excellent bottom coverage is adopted, and reactive sputtering is conducted using $N_2$ gas at a temperature of 100~300° C. under pressure of 1~100 mTorr.

Second, the $WN_x$ layer 214 can be formed through chemical vapor deposition (CVD). In this case, tungsten and nitride source gases are supplied at a temperature of 200~400° C. under pressure of 1~40 Torr, $WF_6$ is used as the tungsten source gas, borane derivatives (e.g., diborane, decaborane, tetraborane, heptaborane, and pentaborane) or silane derivatives (e.g., silane, disilane, and $Si_2H_2Cl_2$) are used as the reduction gas of $WF_6$, and NH3 or $N_2H_4$ is used as the nitride source gas.

Third, the $WN_x$ layer 214 can be formed through atomic layer deposition (ALD). In this case, as in the case of the CVD, ALD is conducted using tungsten and nitride source gases at a temperature of 200~400° C. under pressure of 1~40 Torr. $WF_6$ is used as the tungsten source gas, borane derivatives (e.g., as diborane, decaborane, tetraborane, heptaborane, and pentaborane) or silane derivatives (e.g., silane, disilane, and $Si_2H_2Cl_2$) are used as the reduction gas of $WF_6$, and NH3 or $N_2H_4$ is used as the nitride source gas. At this time, a purge gas such as argon is alternately supplied during the supplying of the source gases. That is to say, the $WN_x$ layer 214 is formed by sequentially and repeatedly carrying out: $WF_6$ supply, Ar purge, $WF_6$ reductant gas supply, Ar purge, nitride source gas supply, and Ar purge. The sequence of $WF_6$ supply, $WF_6$ reductant gas supply, and nitride source gas is an example of one sequence that may be carried out according to the present invention, it should be understood that the sequence of supply may be changed according to embodiments of the present invention.

A W—N—B ternary layer 216 is formed on the surface of the $WN_x$ layer 214 by penetrating boron into the $WN_x$ layer 214. The boron penetration into the $WN_x$ layer 214 is implemented through an annealing that uses boron-based gas, such as $B_2H_6$, or through plasma processing. The W—N—B ternary layer 216 is formed to have a thickness in the range of 10~100% of the thickness of the $WN_x$ layer 214.

Figure 2F:
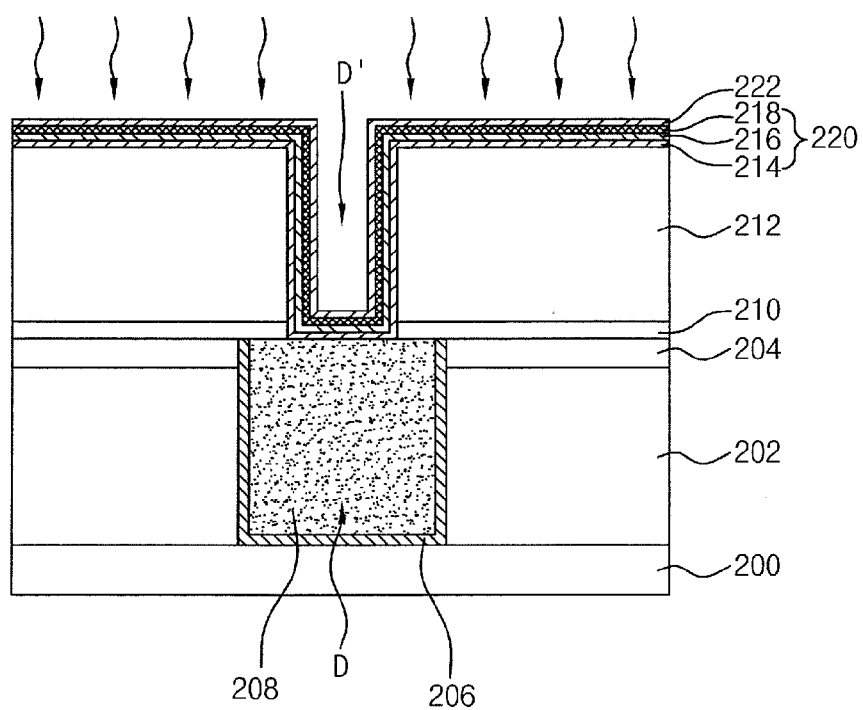

Referring to FIG. 2F, a wetting layer 222 comprising any one of a Ti layer, a TiN layer, a Ta layer, and a TaN layer is formed on the W—N—B ternary layer 216 through any one of PVD, CVD, and ALD to a thickness of 100~500 Å. By annealing the resultant semiconductor substrate 200, having the wetting layer 222 formed thereon, a Ti—N—B ternary layer 218 or a Ta—N—B ternary layer (not shown) is formed on the lower end of the wetting layer 222, which comes into contact with the W—N—B ternary layer 216. As a result, a diffusion barrier 220, which comprises the stack of the $WN_x$ layer 214, the W—N—B ternary layer 216, and the Ti—N—B ternary layer 218, or alternatively the stack of the $WN_x$ layer 214, the W—N—B ternary layer 216, and the Ta—N—B ternary layer, is formed.

The Ti—N—B ternary layer 218 or the Ta—N—B ternary layer is formed due to the fact that boron and nitrogen of the W—N—B ternary layer 216 penetrate into the wetting layer 222 comprising any one of the Ti layer, TiN layer, Ta layer, and TaN layer. The Ti—N—B ternary layer 218 or the Ta—N—B ternary layer is formed to a thickness corresponding to 10~50% of the thickness of the wetting layer 222.

Figure 2G:
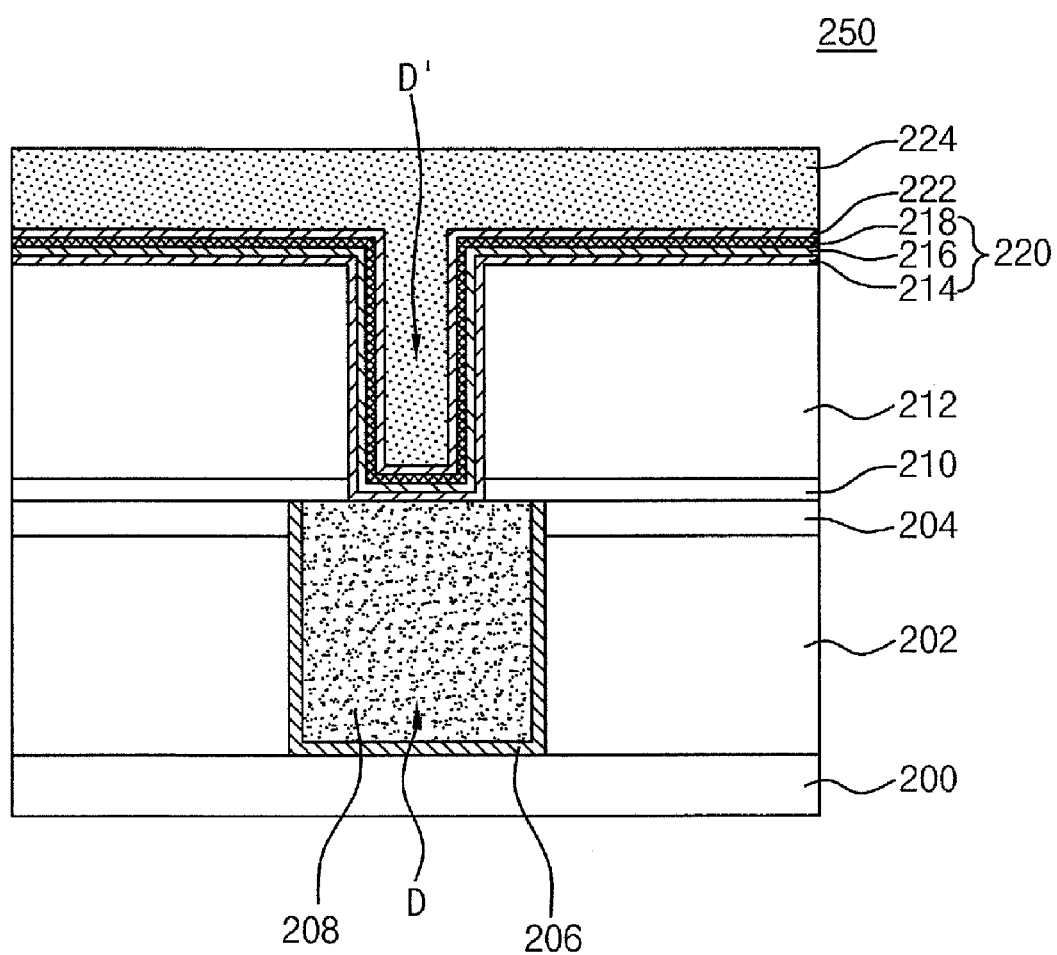

Referring to FIG. 2G, a metal layer, for example an aluminum layer, for an upper metal line is deposited on the wetting layer 222 to fill the second metal line forming region D'. Then, an upper metal line 224 is formed by etching the aluminum layer, the wetting layer 222, and the diffusion barrier 220. As a result, the formation of a metal line 250 according to the embodiment of the present invention is completed.

As is apparent from the above description, in the present invention, when copper is used as the material for a lower metal line and aluminum is used as the material for an upper metal line, the stacked structure of a $WN_x$ layer, a W—N—B ternary layer, and a Ti—N—B ternary layer, or alternatively the stacked structure of a $WN_x$ layer, a W—N—B ternary layer, and a Ta—N—B ternary layer, is formed as a diffusion barrier on the interface of the lower metal line and the upper metal line. A wetting layer is also formed on the diffusion barrier.

In this case, in the present invention, it is possible to form a diffusion barrier having excellent diffusion barrier characteristics, when compared to a conventional diffusion barrier comprising a Ti or TiN layer formed through a sputtering process. Therefore, in the present invention, since it is possible to prevent a high resistance metal compound from being produced, the increase of the contact resistance associated with the conventional device can be prevented. Also, in the present invention, void-free aluminum plug can be formed because the wetting layer allows the deposition of an aluminum layer constituting the upper metal line to be carried out continuously. As a consequence, in the present invention, the formation of the upper metal line can be stably and easily implemented. As a result, in the present invention, it is possible to improve the characteristics and the reliability of a semiconductor device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a metal line structure of a semiconductor device, comprising the steps of:
    forming a lower metal line on a semiconductor substrate;
    forming an insulation layer having a metal line forming region on the resultant semiconductor substrate, wherein the metal line forming region exposes at least a portion of the lower metal line;
    forming a $WN_x$ layer and a W—N—B ternary layer on the insulation layer including a surface of the metal line forming region;
    forming a wetting layer on the W—N—B ternary layer, the wetting layer comprising one of a Ti layer and a TiN layer;
    annealing the resultant semiconductor substrate which is formed with the wetting layer, such that a Ti—N—B ternary layer is formed by transforming a lower portion of the wetting layer, wherein the Ti—N—B ternary layer, the $WN_x$ layer, and the W—N—B ternary layer constitute a diffusion barrier; and
    forming an upper metal line on the wetting layer to fill the metal line forming region.

2. The method according to claim 1, wherein the lower metal line comprises a copper layer, and the upper metal line comprises an aluminum layer.

3. The method according to claim 1, wherein in the $WN_x$ layer, x has a range of 0.3 to 3.0.

4. The method according to claim 1, wherein the $WN_x$ layer is formed to a thickness in the range of 30 to 500 Å.

5. The method according to claim 1, wherein the W—N—B ternary layer is formed by penetrating boron into the $WN_x$ layer.

6. The method according to claim 5, wherein the boron penetration is implemented through one of an annealing that uses boron-based gas and a plasma processing.

7. The method according to claim 5, wherein the W—N—B ternary layer is formed to have a thickness in the range of 10 to 100% of the thickness of the $WN_x$ layer.

8. The method according to claim 1, wherein the wetting layer is formed to a thickness in the range of 100 to 500 Å.

9. The method according to claim 1, wherein the Ti—N—B ternary layer is formed by penetrating boron and nitrogen of the W—N—B ternary layer into the wetting layer comprising one of the Ti layer and the TiN layer.

10. The method according to claim 9, wherein the Ti—N—B ternary layer is formed to a thickness in the range of 10 to 50% of the thickness of the wetting layer.

11. A method for forming a metal line structure of a semiconductor device, comprising the steps of:
    forming a lower metal line on a semiconductor substrate;
    forming an insulation layer having a metal line forming region on the resultant semiconductor substrate, wherein the metal line forming region exposes at least a portion of the lower metal line;
    forming a $WN_x$ layer and a W—N—B ternary layer on the insulation layer including a surface of the metal line forming region;
    forming a wetting layer on the W—N—B ternary layer, the wetting layer comprising one of a Ta layer and a TaN layer;
    annealing the resultant semiconductor substrate which is formed with the wetting layer, such that a Ta—N—B ternary layer is formed by transforming a lower portion of the wetting layer, wherein the Ta—N—B ternary layer, the $WN_x$ layer, and the W—N—B ternary layer constitute a diffusion barrier; and
    forming an upper metal line on the wetting layer to fill the metal line forming region.

12. The method according to claim 11, wherein the lower metal line comprises a copper layer, and the upper metal line comprises an aluminum layer.

13. The method according to claim 11, wherein in the $WN_x$ layer, x has a range of 0.3 to 3.0.

14. The method according to claim 11, wherein the $WN_x$ layer is formed to a thickness in the range of 30 to 500 Å.

15. The method according to claim 11, wherein the W—N—B ternary layer is formed by penetrating boron into the $WN_x$ layer.

16. The method according to claim 15, wherein the boron penetration is implemented through one of an annealing that uses boron-based gas and a plasma processing.

17. The method according to claim 15, wherein the W—N—B ternary layer is formed to have a thickness in the range of 10 to 100% of the thickness of the $WN_x$ layer.

18. The method according to claim 11, wherein the wetting layer is formed to a thickness in the range of 100 to 500 Å.

19. The method according to claim 11, wherein the Ta—N—B ternary layer is formed by penetrating boron and nitrogen of the W—N—B ternary layer into the wetting layer comprising one of the Ta layer and the TaN layer.

20. The method according to claim 19, wherein the Ta—N—B ternary layer is formed to a thickness in the range of 10 to 50% of the thickness of the wetting layer.

* * * * *